(12) United States Patent
Cho et al.

(10) Patent No.: US 9,368,760 B2
(45) Date of Patent: *Jun. 14, 2016

(54) ORGANIC LIGHT EMITTING DIODE DISPLAY

(71) Applicant: SAMSUNG DISPLAY CO., LTD., Yongin, Gyeonggi-Do (KR)

(72) Inventors: Sang-Hwan Cho, Yongin (KR); Soo-Youn Kim, Yongin (KR); Sang-Hyun Park, Yongin (KR); Yoon-Hyeung Cho, Yongin (KR); Seung-Yong Song, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 217 days.

This patent is subject to a terminal disclaimer.

(21) Appl. No.: 14/100,538

(22) Filed: Dec. 9, 2013

(65) Prior Publication Data
US 2014/0367652 A1 Dec. 18, 2014

(30) Foreign Application Priority Data
Jun. 18, 2013 (KR) .................. 10-2013-0069778

(51) Int. Cl.
H01L 27/32 (2006.01)
H01L 51/52 (2006.01)

(52) U.S. Cl.
CPC ........ *H01L 51/5281* (2013.01); *H01L 27/3244* (2013.01); *H01L 51/5253* (2013.01)

(58) Field of Classification Search
None
See application file for complete search history.

(56) References Cited

U.S. PATENT DOCUMENTS

| | | | |
|---|---|---|---|
| 5,049,780 A | 9/1991 | Dobrowolski et al. | |
| 6,146,225 A | 11/2000 | Sheats et al. | |
| 6,411,019 B1 | 6/2002 | Hofstra et al. | |
| 6,545,409 B2 | 4/2003 | Kahen | |
| 6,570,325 B2 | 5/2003 | Graff et al. | |
| 6,876,018 B2 | 4/2005 | Ko | |
| 8,373,928 B2* | 2/2013 | Ha | G02B 5/3058 359/485.05 |
| 2010/0019654 A1* | 1/2010 | Hayashi | H01L 51/5237 313/498 |
| 2012/0133275 A1* | 5/2012 | Lee | H01L 51/5256 313/506 |
| 2014/0077183 A1* | 3/2014 | Lee | H01L 51/5253 257/40 |

FOREIGN PATENT DOCUMENTS

| | | |
|---|---|---|
| KR | 1020060059721 | 2/2006 |
| KR | 1020090092113 | 8/2009 |

OTHER PUBLICATIONS

Zhoaxin Wu, et al., "Contrast-enhancement in organic light emitting-diodes", Mar. 7, 2005, vol. 13, No. 5, Optics Express 1406.
O. Renault, et al., "A low reflectivity multilayer cathode for organic light-emitting diodes", Thin Solid Films, 379 (2000) pp. 195-198.

* cited by examiner

*Primary Examiner* — Ashok Patel
(74) *Attorney, Agent, or Firm* — F. Chau & Associates, LLC

(57) ABSTRACT

An organic light emitting diode (OLED) display includes: a substrate including a plurality of pixels, a thin film transistor disposed in the pixels; an organic light emitting element connected to the thin film transistor and disposed in the pixels, an encapsulation member located on the organic light emitting element, and an external light blocking member disposed above or under the encapsulation member and including a first portion and a second portion. The first portion has a thickness that is thinner than a thickness of the second portion, and the first portion is disposed in the pixels.

20 Claims, 8 Drawing Sheets

ORGANIC LIGHT EMITTING DIODE DISPLAY

CROSS-REFERENCE TO RELATED APPLICATIONS

This application claims priority to Korean Patent Application No. 10-2013-0069778 filed on Jun. 18, 2013, the entire disclosure of which is hereby incorporated by reference herein in its entirety.

1. TECHNICAL FIELD

The present disclosure relates generally to an organic light emitting diode (OLED) display.

2. DISCUSSION OF THE RELATED ART

An organic light emitting diode display may include organic light emitting elements constituted by, for example, a hole injection electrode, an organic emission layer, and an electron injection electrode. Each organic light emitting element emits light by energy generated when an exciton generated by combining an electron and a hole in the organic emission layer falls from an exited state to a ground state, and the organic light emitting diode display displays a predetermined image by using this light emission.

As the organic light emitting diode display has a self-luminance characteristic and a separate light source is not required, unlike a liquid crystal display, the thickness and weight thereof may be reduced. Further, as the organic light emitting diode display may exhibit high quality characteristics such as, for example, low power consumption, high luminance, and rapid response speed, the organic light emitting diode display is receiving attention as a next generation display device.

An OLED display may extract generated light by resonance, and reflection in a thin film transistor, and a capacitor, a driver, and a signal line in a non-light emission area may cause deterioration of contrast.

Thus, a circular polarizer film is used to increase contrast. The circular polarizer film includes a linear polarizer film and a phase difference film according to a method for bonding multiple films.

Such a circular polarizer film is attached after deposition of a thin film encapsulation of a display panel. However, as the circular polarizer film may be as thick as 200 μm, the display device may not be slim and production costs may be increased.

SUMMARY

Exemplary embodiments of the present invention provide an organic light emitting diode (OLED) display which increase a contrast ratio without using a circular polarizer film and making a display device slimmer and more flexible.

An exemplary embodiment provides an organic light emitting diode (OLED) display, including: a substrate including a plurality of pixels, a thin film transistor disposed in the pixels, an organic light emitting element connected to the thin film transistor and disposed in the pixels, an encapsulation member disposed on the organic light emitting element, and an external light blocking member disposed above or under the encapsulation member and including a first portion and a second portion. The first portion has a thickness that is thinner than a thickness of the second portion, and the first portion is disposed in the pixels.

The external light blocking member may include a lower external light blocking member and an upper external light blocking member.

The lower external light blocking member may include a recess portion, and the recess portion may be disposed in the pixels.

The upper external light blocking member may be disposed on the lower external light blocking member.

The upper external light blocking member may include at least one of a metal layer, a metal oxide layer, a metal nitride layer, a dielectric layer, and a black layer, and the upper external light blocking member has a uniform thickness on the lower external light blocking member.

The metal layer may include a material selected from a group consisting of Al, Ag, Mg, Cr, Ti, Ni, Au, Ta, Cu, Ca, Co, Fe, Mo, W, Pt, Yb, and NiS, or an alloy thereof, the metal oxide layer may include one of $CrO_x$, $CuO_x$, or $MoO_x$, the metal nitride layer may include one of $TiN_x$, $TiN_xAl$, or $CrN_x$, and the black layer may be made of a polymer material containing carbon black or a black dye.

The upper external light blocking member including the metal layer, the metal oxide layer, or the metal nitride layer may have a thickness of no greater than about 50 nm.

The dielectric layer may include at least one of $SiO_2$, $TiO_2$, LiF, $CaF_2$, $MgF_2$, $SiN_x$, $Ta_2O_5$, $Nb_2O_5$, SiCN, SiOx, $TiO_x$, $ZrO_2$, MgO, CaO, $Y_2O_3$, $ThF_4$, $YF_3$, $Al_xO_y$, $SiO_xN_y$, $ZrO_xF_y$, $SiO_xF_y$, $AlO_xN_y$, a polymer-based acryl, a polyimide, a polycarbonate, polymethylmethacrylate, polystyrene, polyester, polyethylene, and polyethylene terephthalate.

The dielectric layer may have a thickness of no greater than about 1 μm.

The upper external light blocking member may include a plurality of blocking member layers, each of the blocking member layers may include at least one of a metal layer, a metal oxide layer, a metal nitride layer, a dielectric layer, and a black layer, and the blocking member layers may have a uniform thickness on the lower external light blocking member.

The first portion may have a transmittance of no less than about 40%, and the second portion may have a transmittance that is lower than about 40%.

In accordance with an exemplary embodiment, an organic light emitting diode (OLED) display is provided. The OLED display includes a substrate including a plurality of pixels and a plurality of non-pixel regions, a thin film transistor disposed in the pixels, an organic light emitting element connected to the thin film transistor and disposed in the pixels, an encapsulation member disposed on the organic light emitting element, an interference preventing layer disposed on the encapsulation member and an external light blocking member disposed on the interference preventing layer. The external light blocking member includes a lower external light blocking member disposed in the pixels and in the non-pixel regions and an upper external light blocking member disposed on the lower external light blocking member in the non-pixel regions and in recessed portions of the lower external light blocking member in the pixels. A thickness of the lower external light blocking member disposed in the pixels is less than a thickness of the lower external light blocking member disposed in the non-pixel regions.

In accordance with an exemplary embodiment, an organic light emitting diode (OLED) display is provided. The OLED display includes a substrate including a plurality of pixels and a plurality of non-pixel regions, a buffering layer disposed on the substrate, a semiconductor disposed on the buffering layer, in which the semiconductor includes a source area, a drain area and a channel area disposed between the source area and the drain area, a gate insulating layer disposed on the semiconductor, a gate electrode disposed on the gate insulating layer, an interlayer insulating layer disposed on the gate electrode, in which the interlayer insulating layer and the gate insulating layer include a sources contact hole and a drain contact hole respectively exposing the source area and the drain area, a source electrode and a drain electrode disposed on the interlayer insulating layer, in which the source electrode is connected with the source area through the source contact hole, and the drain electrode is connected with the drain area through the drain contact hole and a protective layer disposed on the interlayer insulating layer and including a contact hole exposing the drain electrode.

The OLED display further includes a first electrode disposed on the protective layer and connected with the drain electrode through the contact hole, a pixel defining layer disposed on the first electrode and including an opening exposing the first electrode, an organic emission layer disposed in the opening of the pixel defining layer, a second electrode disposed on the pixel defining layer and the organic emission layer, an encapsulation member including at least one of an inorganic layer or an organic layer disposed on the second electrode, and an external light blocking member disposed on the encapsulation member. The external light blocking member includes a lower external light blocking member disposed in the pixels and in the non-pixel regions and an upper external light blocking member disposed on the lower external light blocking member in the non-pixel regions and in recessed portions of the lower external light blocking member in the pixels. A thickness of the lower external light blocking member disposed in the pixels is less than a thickness of the lower external light blocking member disposed in the non-pixel regions.

As in an exemplary embodiment, by forming an external light blocking member, it is possible to expect an effect of increasing a contrast ratio without using a thick polarizing plate.

Further, as a thick polarizing plate is not used, the thickness of the OLED display can be reduced to thereby make it slimmer and increase a flexibility characteristic thereof.

BRIEF DESCRIPTION OF THE DRAWINGS

Exemplary embodiments of the present invention can be understood in more detail from the following detailed description taken in conjunction with the attached drawings.

DETAILED DESCRIPTION OF EXEMPLARY EMBODIMENTS

Figure 1:
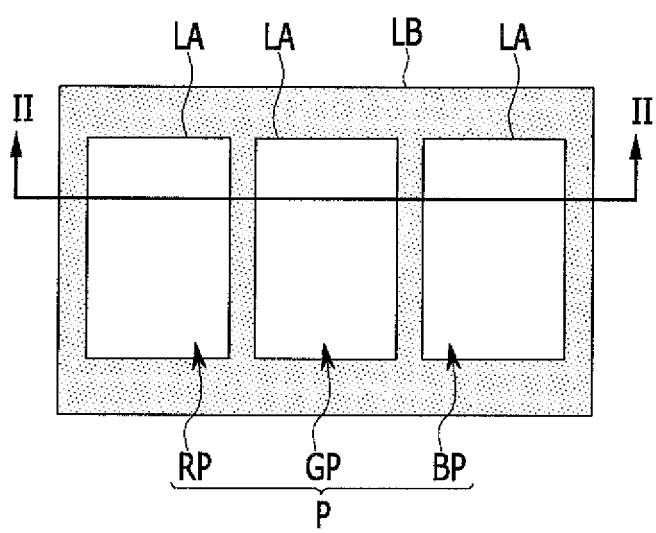
FIG. 1 is a pixel layout view of an organic light emitting diode (OLED) display in accordance with an exemplary embodiment.

In the following detailed description, only certain exemplary embodiments have been shown and described, simply by way of illustration. As those skilled in the art would realize, exemplary embodiments may be modified in various different ways, all without departing from the spirit or scope of the present invention.

In the drawings and this specification, parts or elements that are not related to the description hereof are omitted to clearly describe exemplary embodiments, and the same or like constituent elements designate the same reference numerals throughout the specification.

In addition, the size and thickness of each component shown in the drawings are arbitrarily shown for better understanding and ease of description, but exemplary embodiments of the present invention are not limited thereto.

In the drawings, the thickness of layers, films, panels, regions, etc., may be exaggerated for clarity. In the drawings, for better understanding and ease of description, the thickness of some layers and areas may be exaggerated. Throughout this specification, when a first part of a layer, a film, a plate, or the like is described as being arranged "on" a second part, this indicates the first part is arranged on the second part directly or with a third part therebetween.

Further, throughout this specification, when a part is described as "comprising (or including)" constituent elements, this indicates that the part may further include other constituent elements unless particularly otherwise defined.

Hereinafter, a display device including an optical unit in accordance with an exemplary embodiment will be described with reference to the drawings.

Figure 2:
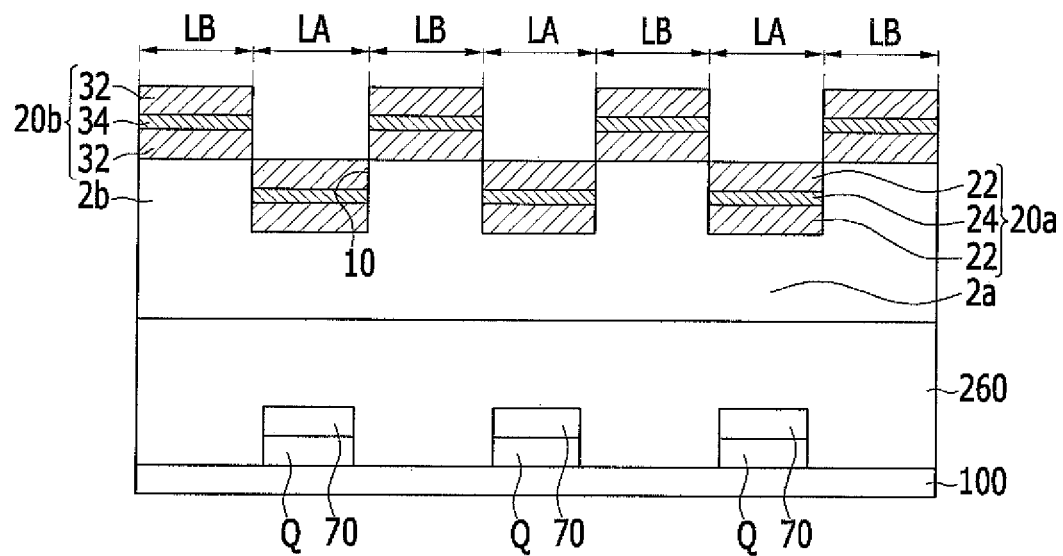
FIG. 2 is a cross-sectional view taken along a line II-II of FIG. 1.

FIG. 1 is a pixel layout view of an organic light emitting diode (OLED) display in accordance with an exemplary embodiment, and FIG. 2 is a cross-sectional view taken along a line II-II of FIG. 1.

As shown in FIG. 1 and FIG. 2, the OLED display in accordance with the present exemplary embodiment includes, for example, a substrate 100, and a plurality of pixels P, each of which includes a thin film transistor Q located on the substrate 100 and an organic light emitting element 70 connected to the thin film transistor Q.

The substrate 100 may be made of, for example, glass, quartz, plastic, or the like. For example, in an embodiment, the substrate 100 may be a flexible substrate formed of a plastic material, such as polyethyeleneterepthalate (PET), polyethyelenennapthalate (PEN), polycarbonate (PC), polyallylate, polyetherimide (PEI), polyethersulphone (PES), polyimide (PI), or the like.

The pixels include, for example, red pixels RP displaying red color, green pixels GP displaying green color, and blue pixels BP displaying blue color. For example, the red, green, and blue colors may be employed as examples of primary colors for displaying full colors, and the red, green, and blue pixels RP, GP, and BP may be employed as primary pixels for displaying full colors. The red pixels RP, the green pixels GP, and the blue pixels BP constituting one group are repeatedly arranged according to the row and column. The group may include other pixels such as, for example, white pixels (not shown) displaying a white color, or the like.

The OLED display includes, for example, pixels LA and non-pixels LB. The pixels LA indicate light emitting areas for displaying colors such as red, green, and blue, and the non-pixels LB indicate the remaining areas except for the pixels LA.

The OLED display includes an external light blocking member 200 for blocking external light, and the external light blocking member 200 includes, for example, a lower external light blocking member 2 commonly formed in the pixels LA and the non-pixels LB, and an upper external light blocking member 20 located on the lower external light blocking member 2.

The thickness of the lower external light blocking member 2 ranges from, for example, about 20 nm to 10 about μm. The lower external light blocking member 2 may be made of, for example, one selected from a group consisting of aluminum (Al), silver (Ag), magnesium (Mg), chromium (Cr), titanium (Ti), nickel (Ni), gold (Au), tantalum (Ta), copper (Cu), calcium (Ca), cobalt (Co), iron (Fe), molybdedum (Mo), tungsten (W), platinum (Pt), ytterbium (Yb), and nickel sulfide (NiS), or an alloy thereof. For example, in an embodiment, the lower external light blocking member 2 may include a metal oxide or a metal nitride such as, e.g., chromium oxide ($CrO_x$), copper oxide ($CuO_x$), molybdenum oxide ($MoO_x$), titanium nitride ($TiN_x$), titanium aluminum nitride $TiAlN_x$, or chromium nitride ($CrN_x$).

The lower external light blocking member 2 may include, for example, a black layer (not shown) formed of a polymer containing carbon black or a black dye.

The lower external light blocking member 2 includes, for example, recess portions 10 located in the pixels LA. Accordingly, the thickness of a lower external light blocking member 2a located in pixels LA may be thinner than that of a lower external light blocking member 2b located in non-pixels LB.

The upper external light blocking member 20 includes, for example, a plurality of blocking member layers, and the blocking member layers may be formed by, for example, stacking a metal layer, a metal nitride layer, a metal oxide layer, a black layer, and a dielectric layer in a single layer or multiple layers. The entire thickness of the upper external light blocking member 20 may range from, for example, about 0.02 μm to about 10 μm.

Metal layers 24 and 34 of the upper external light blocking member 20 may be made of, for example, one selected from a group consisting of Al, Ag, Mg, Cr, Ti, Ni, Au, Ta, Cu, Ca, Co, Fe, Mo, W, Pt, Yb, and NiS, or an alloy thereof, and the metal oxide or the metal nitride may contain, e.g., $CrO_x$, $CuO_x$, $MoO_x$, $TiN_x$, $TiN_xAl$, or $CrN_x$. The metal layers 24 and 34 have a thickness of, for example, no greater than about 50 nm. The black layer may be made of, for example, a polymer material containing carbon black or a black dye and have thickness ranging from, for example, about 0.05 μm to about 10 μm.

The dielectric layers 22 and 32 of the upper external light blocking member 20 may contain at least one of, for example, silicon dioxide ($SiO_2$), titanium dioxide ($TiO_2$), lithium fluoride (LiF), calcium fluoride ($CaF_2$), magnesium fluoride ($MgF_2$), silicon nitride ($SiN_x$), tantalum pentoxide ($Ta_2O_5$), niobium pentoxide ($Nb_2O_5$), silicon carbonitride (SiCN), silicon oxide ($SiO_x$), titanium oxide ($TiO_x$), zirconium oxide ($ZrO_2$), magnesium oxide (MgO), calcium oxide (CaO), yttrium oxide ($Y_2O_3$), thorium tetrafluoride ($ThF_4$), yttrium fluoride ($YF_3$), aluminum oxide ($Al_xO_y$), silicon oxynitride ($SiO_xN_y$), zirconium oxyfluoride ($ZrO_xF_y$), silicon oxyfluoride ($SiO_xF_y$), aluminum oxynitride ($AlO_xN_y$), an acryl, an acryl polymer material, a polyimide, a polycarbonate, polymethylmethacrylate, polystyrene, polyester, polyethylene, and polyethylene terephthalate, and may have a thickness of, for example, no greater than about 1 μm.

In the meantime, referring to FIG. 2, the metal layers 24 and 34 and dielectric layers 22 and 32 may be stacked, for example, in plural in the upper external light blocking member 20. The metal layers 24 and 34 and the dielectric layers 22 and 32 may be, for example, alternatively and repeatedly stacked. The metal layers 24 and 34 and the dielectric layers 22 and 32 of the upper external light blocking member 20 are formed in such a way so as to have, for example, the same thickness along the surface of the lower external light blocking member 2.

Further, the metal layers 24 and 34 and the dielectric layers 22 and 32 are formed of, for example, the same material and have the same stacking structure in the pixels LA and the non-pixels LB. For example, if the dielectric layer 22, the metal layer 24, and the dielectric layer 22 are stacked in the pixels LA in that order, the dielectric layer 32, the metal 34, and the dielectric layer 32 are also stacked in the non-pixels LB in that same order. Further, the dielectric layer 22 or the metal layer 24 stacked in the pixels LA and the dielectric layer 32 or the metal layer 34 stacked in the non-pixels LB are made of, for example, the same material.

As such, if the upper external light blocking member 20 is formed, the upper external light blocking member 20 is formed along the recess portions of the lower external light blocking member 2. Accordingly, according to the depth of the recess portion 10, the external light blocking member 200 formed in the pixels LA has a different thickness from the thickness of the external light blocking member 200 in the non-pixels LB. In other words, the external light blocking member 200 located in the pixels LA is formed to have a thinner thickness than the external light blocking member 200 located in the non-pixels LB.

In accordance with an exemplary embodiment, when recess portions 10 are formed, the difference in the thickness of the external light blocking member 200 formed in the pixels LA and the non-pixels LB is controlled by adjusting the depth of the recess portions 10. However, the difference in the thickness of the external light blocking member 200 formed in the pixels LA and the non-pixels LB is controlled by removing (not shown) all of the lower external light blocking member 2 of the pixels LA and forming the lower external light blocking member 2 having a desired thickness at only the non-pixels LB.

In the meantime, the dielectric layer may have thickness in which destructive interference is generated by, for example, about a 180° phase difference of the light reflected at the metal layer.

The external light blocking member 200 of the pixels LA may have a transmittance of, for example, no less than about 40%, and the external light blocking member 200 of the non-pixels LB may have a transmittance of, for example, that is lower than about 40%.

In the present exemplary embodiment, by forming the external light blocking member 200 in such a way so as to have different thicknesses at the pixels LA and the non-pixels LB, it is possible to prevent external light reflection without forming a circular polarizer film to thereby increase black visibility.

In other words, the light flowing from the outside is blocked by a thick thickness of the external light blocking member 200 located in the non-pixels LB. As the light reflected by the metal layer disappears because of the about 180° phase inversion caused by the dielectric layer, it is possible to prevent the light reflected by the metal layer from being transferred to the outside.

Further, the lower external light blocking member 200 may be formed such that its thickness at the pixels LA is, for example, thinner than its thickness at the non-pixels LB to thereby obtain a transmittance of no less than about 40%.

Hereinafter, a manufacturing method of the OLED display will be described with reference to FIG. 3 and FIG. 4.

Figure 3:
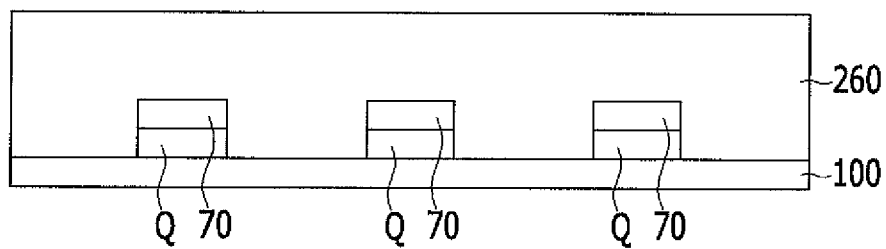
FIG. 3 and FIG. 4 are cross-sectional views sequentially showing a manufacturing method of the OLED display in accordance with an exemplary embodiment.
Figure 4:
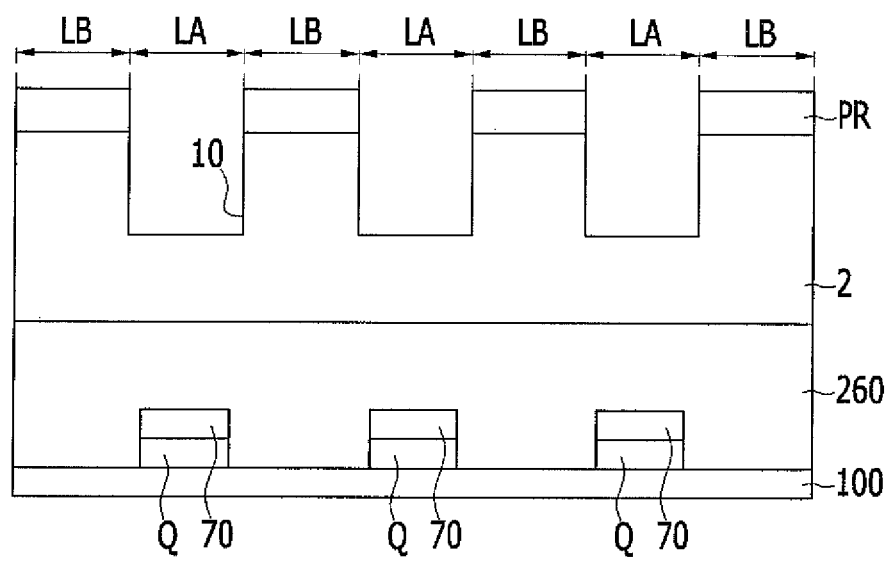
Figure 5:
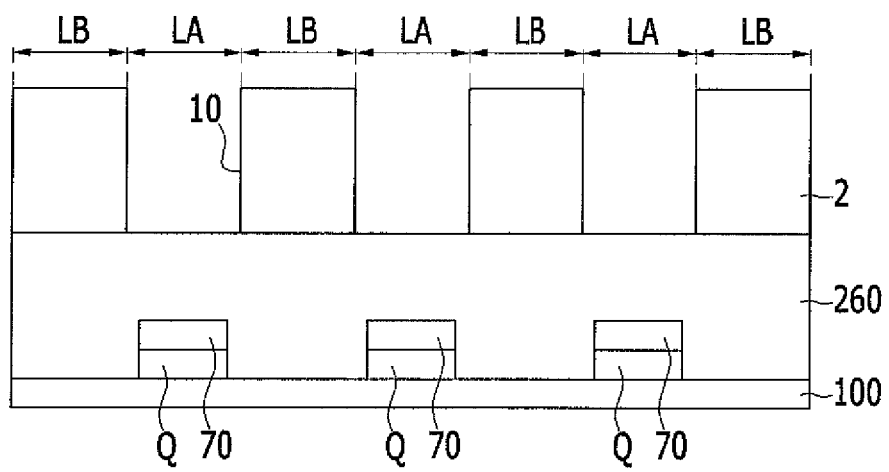
FIG. 5 is a cross-sectional view of a middle step of an OLED display in accordance with an exemplary embodiment.

FIG. 3 and FIG. 4 are cross-sectional views sequentially showing a manufacturing method of the OLED display in accordance with an exemplary embodiment, and FIG. 5 is a cross-sectional view of a middle step of the OLED display in accordance with an exemplary embodiment.

As shown in FIG. 3, the thin film transistor Q and the organic light emitting element 70 are formed on the substrate 100. An encapsulation member 260 is formed to cover the organic light emitting element 70.

Next, as shown in FIG. 4, the lower external light blocking member 2 having the recess portions 10 is formed on the encapsulation member 260. The lower external light blocking member 2 is made of, for example, a metal.

The recess portions 10 of the lower external light blocking member 2, as shown in FIG. 4, may be formed by, for example, forming an etching mask PR on the metal film by a photolithography process and performing an etching process. Alternatively, as shown in FIG. 5, the lower external light blocking member 2 can be, for example, selectively formed in only the non-pixels LB by an ink-jet printing method using liquid ink or a screen printing method using a metal paste. Further alternatively, it is possible to form the lower external light blocking member 2 by forming a metal film and etching the metal film using, for example, a laser or selectively transfer metal layers to the non-pixels LB by using a transfer method.

Next, as shown in FIG. 2, the upper external light blocking member 20 can be formed on the lower external light blocking member 2 by, for example, stacking a dielectric layer and a metal layer thereon.

Figure 6:
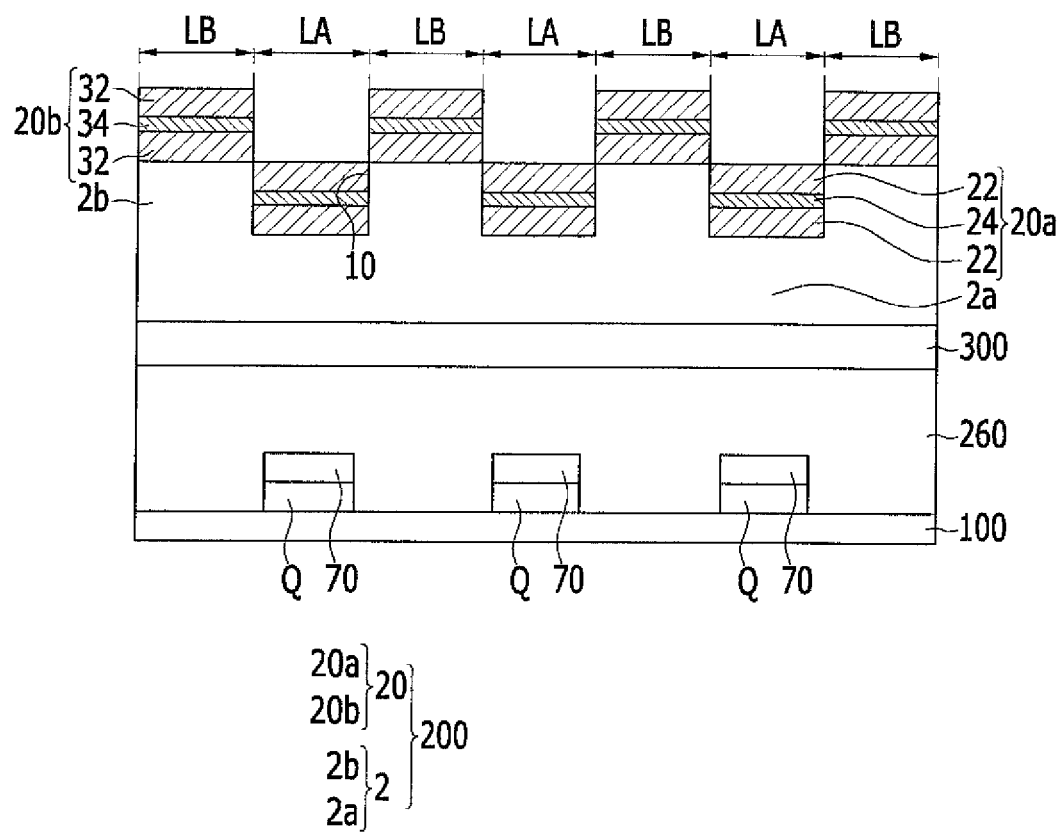
FIG. 6 is a schematic cross-sectional view of the OLED display in accordance with an exemplary embodiment.

FIG. 6 is a schematic cross-sectional view of the OLED display in accordance with an exemplary embodiment.

As most of the interlayer configuration of the OLED display shown in FIG. 6 is the same as that of the OLED display shown in FIG. 2, only different elements will be described in detail.

As shown in FIG. 6, the OLED display of the present exemplary embodiment includes, for example, the substrate 100, the thin film transistor Q located on substrate 100, the organic light emitting element 70 connected to the thin film transistor Q, the encapsulation member 260 located on the light emitting element 70, an interference preventing layer 300 located on the encapsulation member 260, and the external light blocking member 200 located on the interference preventing layer 300.

The interference preventing layer 300 serves to prevent interference between the encapsulation member 260 and the external light blocking member 200. To that end, the interference preventing layer 300 is formed to have, for example, a thickness that is no less than the coherent length of light. In other words, the interference preventing layer 300 can be formed to have thickness of, for example, no less than about 1 μm.

The interference preventing layer 300 may be, for example, an inorganic or organic film, and the inorganic film may contain, for example, at least one of $SiO_2$, $TiO_2$, LiF, $CaF_2$, $MgF_2$, $SiN_x$, $Ta_2O_5$, $Nb_2O_5$, SiCN, $SiO_x$, $TiO_x$, $ZrO_2$, MgO, CaO, $Y_2O_3$, $ThF_4$, $YF_3$, $Al_xO_y$, $SiO_xN_y$, $ZrO_xF_y$, $SiO_xF_y$, and $AlO_xN_y$, or a polymer based acryl, a polyimide, a polycarbonate, polymethylmethacrylate, polystyrene, polyester, polyethylene, and polyethylene terephthalate. The organic film may be made of, for example, a transparent organic polymer or monomer such as an acryl-based material and may contain an acryl, a polyimide, a polycarbonate, polymethylmethacrylate, polystyrene, polyester, polyethylene, and polyethylene terephthalate.

Hereinafter, the OLED display including the external light blocking member will be described in detail with reference to FIG. 7 and FIG. 8.

Figure 7:
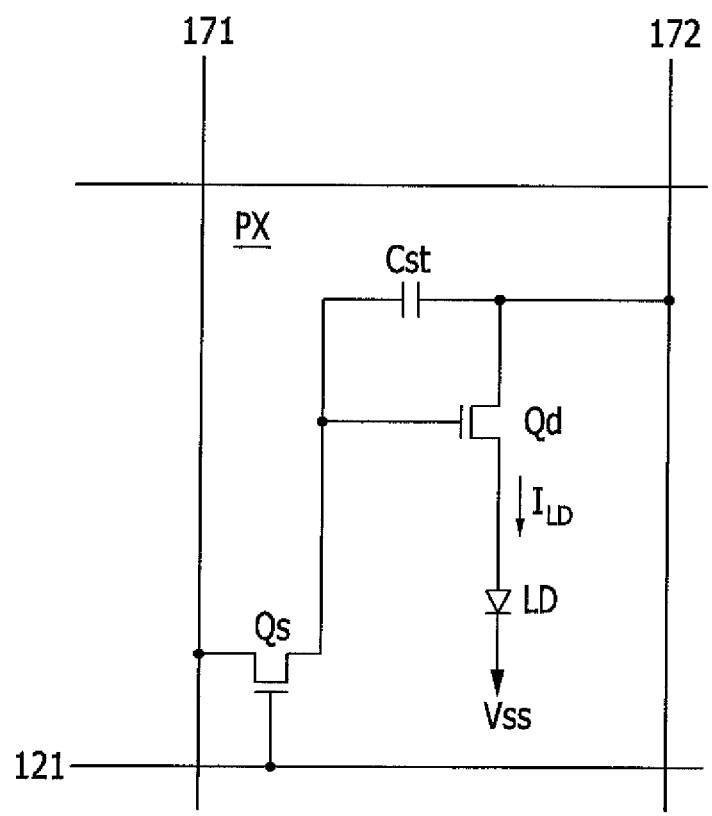
FIG. 7 is an equivalent circuit of a pixel in an OLED display in accordance with an exemplary embodiment.

FIG. 7 is an equivalent circuit of a pixel in an OLED display in accordance with an exemplary embodiment.

The OLED display of the present exemplary embodiment includes, for example, a plurality of signal lines 121, 171, and 172 and pixels PX connected thereto.

The signal lines include, for example, scan signal lines 121 for transferring gate signals (or scan signals), data lines 171 for transferring data signals, driving voltage lines 172 for transferring driving voltages, and the like. The scan signal lines 121 extend, for example, substantially in a row direction and substantially parallel with each other, and the data lines 171 extend, for example, substantially in a column direction and substantially parallel with each other. The driving voltage lines 172 are shown to extend, for example, substantially in a column direction but exemplary embodiments of the present invention are not limited thereto. For example, in an embodiment, the driving voltage lines 172 may extend in the row direction or the column direction, and may be formed in a mesh shape.

One pixel PX includes, for example, a switching transistor Qs, a driving transistor Qd, a storage capacitor Cst, and an organic light emitting element LD.

For example, the switching transistor Qs has a control terminal connected to the corresponding scan signal line 121, an input terminal connected to the corresponding data line 171, and an output terminal connected to the driving transistor Qd. The switching transistor Qs transmits a data signal transferred from the data line 171 to the driving transistor Qd in response to a gate signal transferred from the scan signal line 121.

The driving transistor Qd also has a control terminal connected to the switching transistor Qs, an input terminal connected to the driving voltage line 172, and an output terminal connected to the organic light emitting element LD. The driving transistor Qd flows an output current ILD having a magnitude depending on the voltage between the control terminal and the output terminal thereof.

The capacitor Cst is connected between the control terminal and the input terminal of the driving transistor Qd. The capacitor Cst charges a data signal applied to the control terminal of the driving transistor Qd and maintains the charging of the data signal even after the switching transistor Qs is turned off.

The organic light emitting element LD as an OLED has an anode connected to the output terminal of the driving transistor Qd and a cathode connected to a common voltage Vss. The organic light emitting element LD emits light having an intensity depending on an output current ILD of the driving transistor Qd, thereby displaying images. The organic light emitting element LD may include, for example, an organic material uniquely emitting light of at least one color among primary colors such as three primary colors of red, green, and blue, and the organic light emitting device displays desired images by spatial sums thereof.

Figure 8:
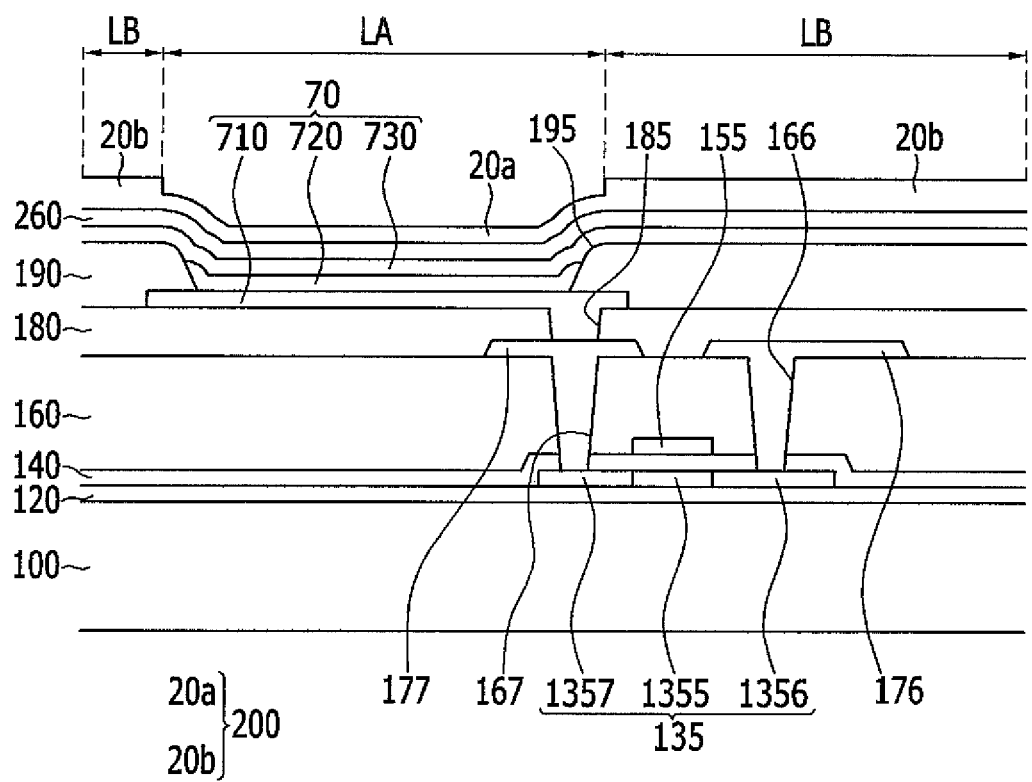
FIG. 8 is a cross-sectional view showing a pixel in the OLED display shown in FIG. 7.

FIG. 8 is a cross-sectional view showing a pixel in the OLED display shown in FIG. 7.

With reference to FIG. 8, a structure of the OLED display will be described based on the thin film transistor Qd and the organic light emitting element 70 of FIG. 7 in detail according to the stacking order. Hereinafter, the driving transistor Qd is referred to as a thin film transistor.

As shown in FIG. 8, a buffering layer 120 that prevents permeation of unnecessary components such as, for example, impurities or moisture and at the same time planarizes the surface is formed on the substrate 100.

A semiconductor 135 including, for example, an inorganic semiconductor such as an oxide semiconductor or an organic semiconductor may be formed on the buffering layer 120. In an embodiment, the semiconductor 135 may be made of, for example, amorphous silicon (e.g. hydrogenated amorphous silicon). Alternatively, in an embodiment, the semiconductor 135 may be formed of, for example, polysilicon, micro-crystal silicon, or single crystal silicon.

For example, in the present exemplary embodiment, a semiconductor 135 formed of, for example, polysilicon is formed on the buffering layer 120.

The semiconductor 135 is divided into, for example, a channel area 1355, a source area 1356, and a drain area 1357. The source area 1356 and the drain area 1357 are formed at opposite sides of the channel area 1355. The channel area 1355 of the semiconductor 135 is, for example, polysilicon not doped with an impurity, that is, an intrinsic semiconductor. The source area 1356 and the drain area 1357 of the semiconductor 135 are, for example, polysilicon doped with a conductive impurity, that is, impurity semiconductors.

The impurity doped to the source area 1356 and the drain area 1357 may be one of a p-type impurity and an n-type impurity.

A gate insulating layer 140 is formed on the semiconductor 135. The gate insulating layer 140 may be, for example, a single layer or multi-layer including at least one of tetraethyl orthosilicate (TEOS), silicon nitride, silicon oxide, silicon oxynitride (SiON), aluminum oxide (AlOx), yttrium oxide ($Y_2O_3$), hafnium oxide (HfOx), zirconium oxide (ZrOx), aluminum nitride (AlN), aluminum oxynitride (AlNO), titanium oxide (TiOx), barium titanate (BaTiO3), and lead titanate ($PbTiO_3$).

A gate electrode 155 is formed on the gate insulating layer 140. The gate electrode 155 is overlapped with the channel area 1355. The gate electrode 155 may include, for example, silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), molybdenum (Mo), titanium (Ti), tungsten (W), molybdenum tungsten (MoW), and aluminum (Al)/copper (Cu), copper (Cu), zinc (Zn), cobalt (Co), manganese (Mn), iridium (Ir), rhodium (Rh), osmium (Os), tantalum (Ta), or a compound of any of these.

An interlayer insulating layer 160 is formed on the gate electrode 155. Like the gate insulating layer 140, the interlayer insulating layer 160 may be formed of, for example, tetraethyl orthosilicate (TEOS), silicon nitride, silicon oxide, silicon oxynitride (SiON), aluminum oxide (AlOx), yttrium oxide ($Y_2O_3$), hafnium oxide (HfOx), zirconium oxide (ZrOx), aluminum nitride (AlN), aluminum oxynitride (AlNO), titanium oxide (TiOx), barium titanate (BaTiO3), and lead titanate ($PbTiO_3$).

The interlayer insulating layer 160 and the gate insulating layer 140 have, for example, a source contact hole 166 and a drain contact hole 167 respectively exposing the source area 1356 and the drain area 1357. A source electrode 176 and a drain electrode 177 are formed on the interlayer insulating layer 160. The source electrode 176 is connected with the source area 1356 through the source contact hole 166, and the drain electrode 177 is connected with the drain area 1357 through the drain contact hole 167. The source electrode 176 and the drain electrode 177 may include, for example, silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), molybdenum (Mo), titanium (Ti), tungsten (W), molybdenum tungsten (MoW), and aluminum (Al)/copper (Cu), copper (Cu), zinc (Zn), cobalt (Co), manganese (Mn), iridium (Ir), rhodium (Rh), osmium (Os), tantalum (Ta), or a compound of any of these.

A protective layer 180 is formed on the interlayer insulating layer 160. The protective layer 180 includes, for example, a contact hole 185 that exposes the drain electrode 177.

A first electrode 710 connected with the drain electrode 177 through the contact hole 185 is formed on the protective layer 180. The first electrode 710 becomes the anode of the organic light emitting element of FIG. 6.

A pixel defining layer 190 is formed on the first electrode 710.

The pixel defining layer 190 includes, for example, an opening 195 exposing the first electrode 710. The pixel defining layer 190 may be formed to include, for example, a resin such as a polyacrylate or a polyimide and an inorganic material such as silica.

An organic emission layer 720 is formed in the opening 195 of the pixel defining layer 190.

The organic emission layer 720 is formed as, for example, a multi-layer including one or more of a light emission layer, a hole injection layer (HIL), a hole transport layer (HTL), an electron transport layer (ETL), and an electron injection layer (EIL).

For example, if the organic emission layer 720 includes all of them, the electron injection layer is disposed on the first electrode 710, on which the electron transport layer, the organic emission layer, the hole transport layer, and the hole injection layer are then sequentially stacked.

A second electrode 730 is formed on the pixel defining layer 190 and the organic emission layer 720.

The second electrode 730 becomes the cathode of the organic light emitting element 70 of FIG. 5. Thus, the first electrode 710, the organic emission layer 720, and the second electrode 730 form the organic light emitting element 70.

The OLED display may be structured in any one of a front surface display type, a rear surface display type, and a both surface display type, depending upon the light-emitting direction of the organic light emitting element 70.

When the OLED display is structured as the front surface display type, the first electrode 710 is formed, for example, with a reflective film and the second electrode 730 is formed with a semitransparent film. When the OLED display is structured as the rear surface display type, the first electrode 710 is formed with, for example, a semitransparent film and the second electrode 730 is formed with, for example, a reflective film. When the OLED display is structured as the both surface display type, the first electrode 710 and the second electrode 730 are formed with, for example, a transparent film or a semitransparent film.

The reflective film and the semitransparent film are formed with, for example, at least one metallic material selected from magnesium (Mg), silver (Ag), gold (Au), calcium (Ca), lithium (Li), chromium (Cr), aluminum (Al), and alloys thereof. Whether a given film is a reflective film or a semitransparent film is determined depending upon the thickness thereof. With the semitransparent film, the smaller the thickness is, the more light transmittance is increased, while the smaller the thickness is, the more the resistance is increased.

The transparent film is formed of, for example, indium tin oxide (ITO), indium zinc oxide (IZO), zinc oxide (ZnO), indium oxide ($In_2O_3$), or the like.

An encapsulation member 260 may be formed of an inorganic layer or an organic layer on the second electrode 730, and the inorganic layer and the organic layer may be, for example, alternately stacked. The encapsulation member 260 protects a pixel from external air.

One or more organic layers and one or more inorganic layers may be alternately stacked. The inorganic layer or the organic layer may each be provided, for example, in plural.

The organic layer is formed of, for example, a polymer. For example, in an embodiment, the organic layer may be a single layer or a laminated layer formed of any one of polyethylene terephthalate, polyimide, polycarbonate, epoxy, polyethylene, and polyacrylate. For example, in an embodiment, the organic layer may be formed of polyacrylate, and specifically, includes a matter where a monomer composition including a diacrylate-based monomer and a triacrylate-based monomer is polymerized. In addition, a monoacrylate-based monomer may, for example, be further included in the monomer composition. Further, a known photoinitiator such as, for example, 2,4,6-Trimethylbenzoyldiphenylphosphine oxide (TPO) may be further included in the monomer composition, but exemplary embodiments of the present invention are not limited thereto.

The inorganic layer may be, for example, a single layer or a laminated layer including a metal oxide or a metal nitride. For example, the inorganic layer may include any one of $SiN_x$, $Al_2O_3$, $SiO_2$, and $TiO_2$.

The uppermost layer of the encapsulation member 260, which is exposed to the outside, may be formed of the inorganic layer to prevent permeation of moisture to the organic light emitting element 70.

The encapsulation member 260 may include, for example, at least one sandwich structure in which at least one organic layer is inserted between at least two inorganic layers. Further, the encapsulation member 260 may include, for example, at least one sandwich structure in which at least one inorganic layer is inserted between at least two organic layers.

A halogenated metal layer including, for example, LiF may be further included between the second electrode 730 and the inorganic layer. The halogenated metal layer may prevent a display portion including the second electrode 730 from being damaged when the inorganic layer is formed by, for example, a sputtering manner or a plasma deposition manner.

The encapsulation member 260 may be replaced by, for example, an encapsulation substrate such as a metal substrate or a glass substrate instead of forming the organic layer and the inorganic layer.

The same external light blocking member 200 as that in FIGS. 1-6 is formed on the encapsulation member 260. The external light blocking member 200 is formed to have, for example, different thicknesses in the pixels LA and the non-pixels LB. The thickness of the external light blocking member 200 disposed in the pixels LA is, for example, thinner than the thickness of the external light blocking member 200 disposed in the non-pixels LB.

Having described exemplary embodiments of the present invention, it is further noted that it is readily apparent to those of ordinary skill in the art that various modifications may be made without departing from the spirit and scope of the invention which is defined by the metes and bounds of the appended claims.

What is claimed is:
1. An organic light emitting diode (OLED) display, comprising:
   a substrate including a plurality of pixels and a plurality of non-pixel areas;
   a thin film transistor disposed in the pixels;
   an organic light emitting element connected to the thin film transistor and disposed in the pixels;
   an encapsulation member disposed on the organic light emitting element; and
   an external light blocking member disposed in both the pixels and the non-pixel areas, either above or under the encapsulation member and including a first portion and a second portion,
   wherein the first portion has a thickness that is thinner than a thickness of the second portion,
   wherein the first portion is disposed in the pixels, and
   wherein the second portion is disposed in the non-pixel areas.

2. The OLED display of claim 1, wherein the external light blocking member includes a lower external light blocking member and an upper external light blocking member.

3. An organic light emitting diode (OLED) display, comprising:
   a substrate including a plurality of pixels;
   a thin film transistor disposed in the pixels;
   an organic light emitting element connected to the thin film transistor and disposed in the pixels;
   an encapsulation member disposed on the organic light emitting element; and
   an external light blocking member disposed above or under the encapsulation member and including a first portion and a second portion,
   wherein the first portion has a thickness that is thinner than a thickness of the second portion, and
   wherein the first portion is disposed in the pixels,
   wherein the external light blocking member includes a lower external light blocking member and an upper external light blocking member, and
   wherein the lower external light blocking member includes a recess portion, and the recess portion is disposed in the pixels.

4. The OLED display of claim 3, wherein the upper external light blocking member is disposed on the lower external light blocking member.

5. The OLED display of claim 4, wherein the upper external light blocking member includes at least one of a metal layer, a metal oxide layer, a metal nitride layer, a dielectric layer, and a black layer, and wherein the upper external light blocking member has a uniform thickness on the lower external light blocking member.

6. The OLED display of claim 5, wherein the metal layer comprises a material selected from the group consisting of aluminum (Al), silver (Ag), magnesium (Mg), chromium (Cr), titanium (Ti), nickel (Ni), gold (Au), tantalum (Ta), copper (Cu), calcium (Ca), cobalt (Co), iron (Fe), molybdenum (Mo), tungsten (W), platinum (Pt), ytterbium (Yb), nickel sulfide (NiS), or an alloy thereof, the metal oxide layer comprises one of chromium oxide ($CrO_x$), copper oxide ($CuO_x$), or molybdenum oxide ($MoO_x$), the metal nitride layer comprises one of titanium nitride ($TiN_y$), $TiAlN_x$, or chromium nitride ($CrN_x$), and wherein the black layer comprises a polymer material including carbon black or a black dye.

7. The OLED display of claim 5, wherein the upper external light blocking member includes the metal layer, the metal oxide layer, or the metal nitride layer and has a thickness of no greater than about 50 nm.

8. The OLED display of claim 5, wherein the dielectric layer comprises at least one of silicon dioxide ($SiO_2$), titanium dioxide ($TiO_2$), lithium fluoride (LiF), calcium fluoride ($CaF_2$), magnesium fluoride ($MgF_2$), silicon nitride ($SiN_x$), tantalum pentoxide ($Ta_2O_5$), niobium pentoxide ($Nb_2O_5$), silicon carbonitride (SiCN), silicon oxide ($SiO_x$), titanium oxide ($TiO_x$), zirconium oxide ($ZrO_2$), magnesium oxide (MgO), calcium oxide (CaO), yttrium oxide ($Y_2O_3$), thorium tetrafluoride ($ThF_4$), yttrium fluoride ($YF_3$), aluminum oxide ($Al_xO_y$), silicon oxynitride ($SiO_xN_y$), zirconium oxyfluoride ($ZrO_xF_y$), silicon oxyfluoride ($SiO_xF_y$), aluminum oxynitride ($AlO_xN_y$), r a polymer-based acryl, a polyimide, a polycarbonate, polymethylmethacrylate, polystyrene, polyester, polyethylene, and polyethylene terephthalate.

9. The OLED display of claim 5, wherein the dielectric layer has a thickness of no greater than about 1 μm.

10. The OLED display of claim 4, wherein the upper external light blocking member includes a plurality of blocking member layers, wherein each of the blocking member layers includes at least one of a metal layer, a metal oxide layer, a metal nitride layer, a dielectric layer, and a black layer, and wherein the blocking member layers have a uniform thickness on the lower external light blocking member.

11. The OLED display of claim 10, wherein the metal layer comprises a material selected from the group consisting of aluminum (Al), silver (Ag), magnesium (Mg), chromium (Cr), titanium (Ti), nickel (Ni), gold (Au), tantalum (Ta), copper (Cu), calcium (Ca), cobalt (Co), iron (Fe), molybdenum (Mo), tungsten (W), platinum (Pt), ytterbium (Yb), nickel sulfide (NiS), or an alloy thereof, wherein the metal oxide layer comprises one of chromium oxide ($CrO_x$), copper oxide ($CuO_x$), or molybdenum oxide ($MoO_x$), wherein the metal nitride layer comprises one of titanium nitride ($TiN_x$), titanium aluminum nitride ($TiAlN_x$), or chromium nitride ($CrN_x$), and wherein the black layer comprises a polymer material including carbon black or a black dye.

12. The OLED display of claim 10, wherein the upper external light blocking member including the metal layer, the metal oxide layer, or the metal nitride layer has thickness of no greater than about 50 nm.

13. The OLED display of claim 10, wherein the dielectric layer comprises at least one of silicon dioxide ($SiO_2$), titanium dioxide ($TiO_2$), lithium fluoride (LiF), calcium fluoride ($CaF_2$), magnesium fluoride ($MgF_2$), silicon nitride ($SiN_x$), tantalum pentoxide ($Ta_2O_5$), niobium oxide ($Nb_2O_5$), silicon carbonitride (SiCN), silicon oxide ($SiO_x$), titanium oxide ($TiO_x$), zirconium oxide ($ZrO_2$), magnesium oxide (MgO), calcium oxide (CaO), yttrium oxide ($Y_2O_3$), thorium tetrafluoride ($ThF_4$), yttrium fluoride ($YF_3$), aluminum oxide ($Al_xO_y$), silicon oxynitride ($SiO_xN_y$), zirconium oxyfluoride ($ZrO_xF_y$), silicon oxyfluoride ($SiO_xF_y$), aluminum oxynitride ($AlO_xN_y$), a polymer-based acryl, a polyimide, a polycarbonate, polymethylmethacrylate, polystyrene, polyester, polyethylene, and polyethylene terephthalate.

14. The OLED display of claim 10, wherein the dielectric layer has thickness of no greater than about 1 μm.

15. The OLED display of claim 1, wherein the first portion has a transmittance of no less than about 40%, and the second portion has a transmittance that is lower than about 40%.

16. An organic light emitting diode (OLED) display, comprising:
- a substrate including a plurality of pixels and a plurality of non-pixel regions;
- a thin film transistor disposed in the pixels;
- an organic light emitting element connected to the thin film transistor and disposed in the pixels;
- an encapsulation member disposed on the organic light emitting element;
- an interference preventing layer disposed on the encapsulation member; and
- an external light blocking member disposed on the interference preventing layer,
- wherein the external light blocking member includes a lower external light blocking member disposed in the pixels and in the non-pixel regions and an upper external light blocking member disposed on the lower external light blocking member in the non-pixel regions and in recessed portions of the lower external light blocking member in the pixels,
- wherein a thickness of the lower external light blocking member disposed in the pixels is less than a thickness of the lower external light blocking member disposed in the non-pixel regions.

17. The OLED display of claim 16, wherein the interference preventing layer has a thickness of no less than about 1 μm.

18. The OLED display of claim 17, wherein the interference preventing layer comprises one of an inorganic film or an organic film.

19. The OLED display of claim 18, wherein the interference preventing layer comprises at least one material selected from the group consisting of silicon dioxide ($SiO_2$), titanium dioxide ($TiO_2$), lithium fluoride (LiF), calcium fluoride ($CaF_2$), magnesium fluoride ($MgF_2$), silicon nitride ($SiN_x$), tantalum pentoxide ($Ta_2O_5$), niobium pentoxide ($Nb_2O_5$), silicon carbonitride (SiCN), silicon oxide ($SiO_x$), titanium oxide ($TiO_x$), zirconium oxide ($ZrO_2$), magnesium oxide (MgO), calcium oxide (CaO), yttrium oxide ($Y_2O_3$), thorium tetrafluoride ($ThF_4$), yttrium fluoride ($YF_3$), aluminum oxide ($Al_xO_y$), silicon oxynitride ($SiO_xN_y$), zirconium oxyfluoride ($ZrO_xF_y$), silicon oxyfluoride ($SiO_xF_y$), and aluminum oxynitride ($AlO_xN_y$).

20. The OLED display of claim 18, wherein the interference preventing layer comprises at least one material selected from the group consisting of an acryl, a polyimide, a polycarbonate, polymethylmethacrylate, polystyrene, polyester, polyethylene, and polyethylene terephthalate.

* * * * *